(12) United States Patent
Wanes et al.

(10) Patent No.: US 6,965,517 B2
(45) Date of Patent: Nov. 15, 2005

(54) COMPONENT SUBSTRATE FOR A PRINTED CIRCUIT BOARD AND METHOD OF ASSEMBYLING THE SUBSTRATE AND THE CIRCUIT BOARD

(75) Inventors: John O Wanes, Richmond Hill (CA); David L Gauthier, Orton (CA); Albert J Kerklaan, Milton (CA); Kai K Ho, Scarborough (CA)

(73) Assignee: C&D/Charter Holdings, Inc., Wilmington, DE (US)

( * ) Notice: Subject to any disclaimer, the term of this patent is extended or adjusted under 35 U.S.C. 154(b) by 242 days.

(21) Appl. No.: 10/278,778

(22) Filed: Oct. 24, 2002

(65) Prior Publication Data

US 2004/0012926 A1    Jan. 22, 2004

(30) Foreign Application Priority Data

Jul. 22, 2002 (CA) ..................................... 2394403

(51) Int. Cl.[7] .......................... H05K 7/02; H05K 7/06; H05K 7/08; H05K 7/10; H05K 5/02
(52) U.S. Cl. ...................... 361/760; 361/813; 361/803
(58) Field of Search .............................. 361/813, 760, 361/782, 784, 803, 804, 720, 721, 723; 257/691

(56) References Cited

U.S. PATENT DOCUMENTS 5,661,343 A * 8/1997 Takahashi et al. .......... 257/723
6,232,654 B1 * 5/2001 Nagase ....................... 257/678

* cited by examiner

Primary Examiner—Phuong T. Vu
(74) Attorney, Agent, or Firm—Hoffmann & Baron, LLP

(57) ABSTRACT

The invention provides a system and method for assembling an electrical module. The module comprises a circuit board, a substrate and an electrical component carried on the substrate. The substrate is formed by a stamping process an is mounted at a location on the circuit board. The substrate forms part of an electrical circuit with a circuit in the circuit board and dissipates heat from the circuit board. The substrate and the circuit board are both initially carried in respective frames. Alignment registered in the frames allow the frames to be aligned such that the substrate is positioned at the location on the circuit board.

13 Claims, 14 Drawing Sheets

COMPONENT SUBSTRATE FOR A PRINTED CIRCUIT BOARD AND METHOD OF ASSEMBYLING THE SUBSTRATE AND THE CIRCUIT BOARD

FIELD OF INVENTION

The invention relates generally to the field of electronic modules and methods of assembling same. In particular, the invention relates to devices and methods of assembly relating to components for printed circuit boards ("PCBs").

BACKGROUND OF INVENTION

As is known in the art, a PCB embodies an electrical circuit which includes electrical components. In addition to functional characteristics of the circuit, operational characteristics, such as form factor, heat dissipation, track sizes and weights, must adequately be considered for the circuit contained in the PCB. For example, for a power converter PCB, power conversion components in the circuit generate significant amounts of heat, which must be properly dissipated. Also, the electrical tracks in the PCB for the circuit must be large enough to handle the high currents flowing therethrough.

Many PCBs utilize surface mount component technologies. These relatively small components generally have fine track widths on an exposed surface of a PCB. However, in order to obtain fine track widths, a relatively thin layer of copper must be used on the surface of the PCB. Generally, a thin layer of copper will not have the heat dissipation nor the current carrying capabilities of a thicker layer of copper. As well, as assemblies of electronic components become more complex, resort must be had to an increasingly greater number of substrate layers in a typical PCB. In many instances, conductive layers within such multilayer PCBs are thinner than their counterparts in PCBs which contain fewer layers.

All of the foregoing creates challenges and constraints for size reduction, heat dissipation and current carrying capability in the design and manufacture of assemblies of electronic components. There is therefore a need for an assembly that can carry relatively high electrical currents, that can dissipate heat for components mounted onto a PCB and that can be presented in a relatively compact size as compared to the existing art.

SUMMARY OF INVENTION

In a first aspect of the invention, a circuit module is provided. The module includes an electrical component and a substrate formed from a stamping process. The substrate has an exposed layer of electrically conductive material. One terminal of the component is attached to the exposed layer and the circuit module is attached to a circuit board to complete an electrical circuit on the circuit board.

The substrate may include a first portion and a second portion located apart from the first portion. One terminal of the component may be attached to the first portion and another terminal of the component may be attached to the second portion.

A nib may be provided on the second portion, with the second terminal attached to the nib and the nib being excisable from the second portion.

The electrical circuit may be a power conversion circuit with the substrate comprising a part of a winding associated with the power conversion circuit.

The circuit module may be attachable to the circuit board by a soldering process.

Also, the substrate may be adapted to transfer heat from the circuit board. Further, the substrate may have at least one fin to transfer heat from the circuit board. Also, the substrate may have a raised portion providing a space between the raised portion and the PCB when the substrate is attached to the PCB. Also, the substrate may have a thickness enabling it to carry an electrical current of at least 5 amperes.

In a second aspect, an electronic module is provided. The module consists of a circuit board, a substrate attached to a location on a surface of the circuit board and an electrical component carried on the substrate. The substrate is formed from a stamping process, is adapted to dissipate heat from the circuit board and completes a part of an electrical circuit on the circuit board.

The electrical circuit may be a power conversion circuit and the substrate may be a part of a winding associated with the circuit.

The substrate may have a first portion and a second portion located apart from the first portion, with a terminal of the electrical component attached to the first portion and another terminal of the component attached to the second portion.

For the module, the electrical component may be a transistor.

Further, the substrate may have at least one fin.

Further still, the substrate may be attached to the circuit board by a soldering process.

In a third aspect, a substrate blank is provided. The blank comprises a substrate which can be attached to a location on a circuit board and a frame connected to the substrate. There is an alignment register on the frame which facilitates locating the substrate at the location on the circuit board.

The frame may have a first rail and a second rail in a spaced relationship thereto, with the substrate located between the first and second rail.

The alignment register may be an opening in the frame, which is co-operable with a corresponding alignment register in the circuit board.

The substrate may carry an electrical component.

Further still, the substrate may have a first portion and a second portion located apart from the first portion, with the electrical component attached to the first portion and the second portion.

In a fourth aspect, a system of components for assembling an electronic module is provided. The electronic module includes a circuit board and a substrate mounted at a location on the circuit board. The system includes a first frame having both the substrate and a first alignment register and a second frame having both the circuit board and a second alignment register. The first and second alignment registers enable the substrate to be aligned at the location of the circuit board when the alignment registers co-operate with each other.

The substrate may carry an electrical component.

The substrate may have a first portion and a second portion located apart from the first portion, with the electrical component is attached to the first portion and the second portion.

In other aspects the invention provides various combinations and subsets of the aspects described above.

BRIEF DESCRIPTION OF DRAWINGS

For the purposes of description, but not of limitation, the foregoing and other aspects of the invention are explained in greater detail with reference to the accompanying drawings, in which:

FIG. 9A is a perspective view of an assembly of a PCB and a populated substrate in accordance with another embodiment;

DETAILED DESCRIPTION OF EMBODIMENTS

Figure 1A:
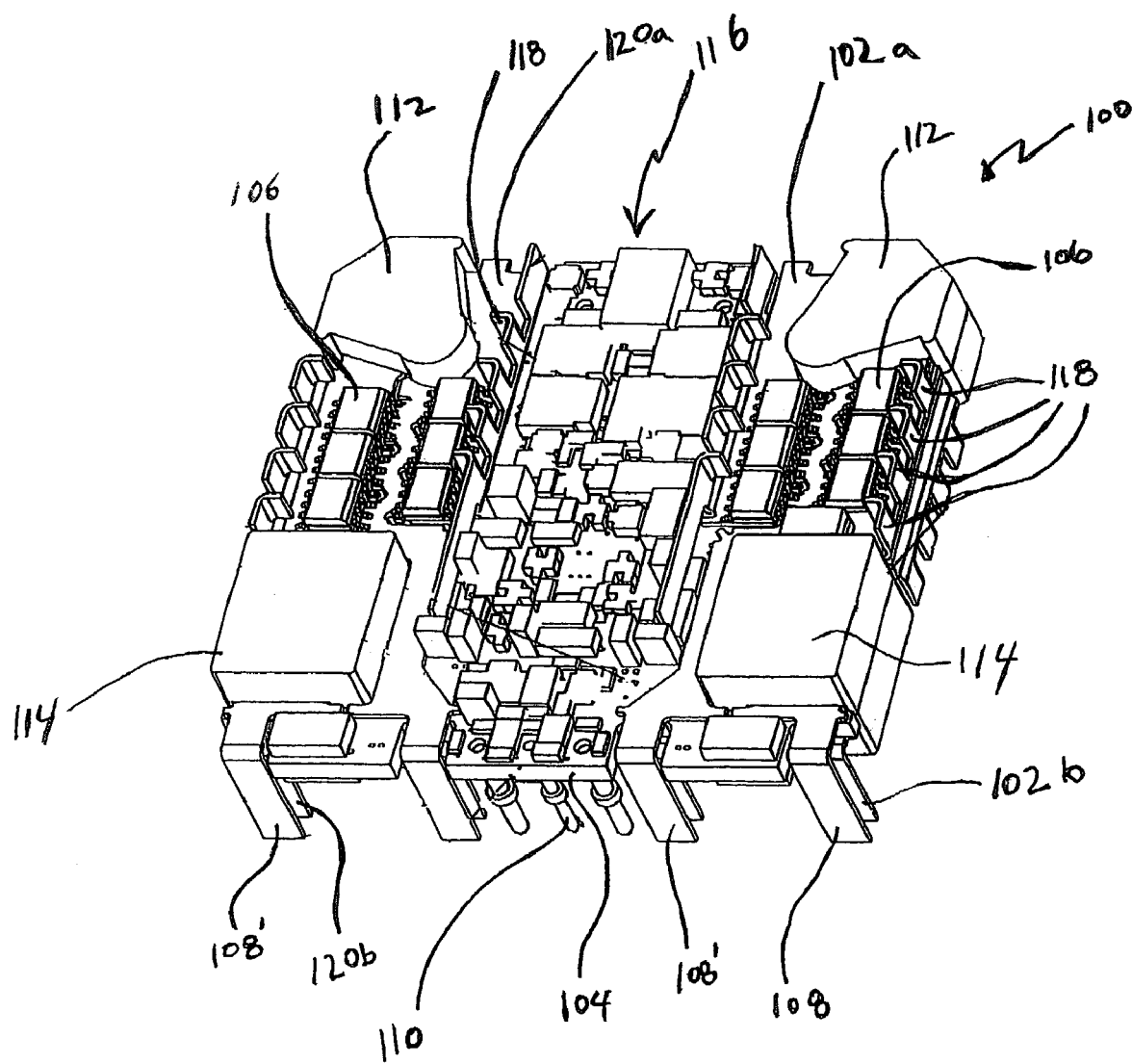
FIG. 1A is a perspective view of a PCB and a populated substrate for a power conversion module in accordance with an embodiment of the invention.

The description which follows, and the embodiments described therein, are provided by way of illustration of an example, or examples, of particular embodiments of the principles of the present invention. These examples are provided for the purposes of explanation, and not limitation, of those principles and of the invention. In the description which follows, like parts are marked throughout the specification and the drawings with the same respective reference numerals.

Referring to FIG. 1, an electronic module in the form of assembled DC to DC power converter 100 is shown according to an embodiment of the invention. Power converter 100 is provided to illustrate aspects of the embodiment. It will be appreciated that other modifications, adaptations and variations of the embodiments disclosed herein may be made without departing from the scope of the invention. Accordingly, the invention is not limited to electronic modules in the field of power converters.

As shown, power converter 100 includes four substrates 102 (102a and 102b) and 120 (120a and 120b) mounted to a printed circuit board ("PCB") 104 with two substrates mounted on each side of PCB 104. Substrate 120 has a mirror image configuration of substrate 102. Unless the particular context suggests otherwise, reference in the following description to substrate 102 may also include substrate 120. Each substrate 102 carries electrical components, which, in the particular example as shown, are field effect transistors 106 ("FETs"). Substrate 102 is configured to carry FETs 106, and substrate 102 forms a portion of an electrical circuit for FETs 106, a power source (not shown), and PCB 104. In this configuration, substrate 102 defines a single-layer circuit track which connects to a circuit defined in the layout of PCB 104. As described in greater detail below, portions of the circuit track in substrate 102 provide windings for transformer 112 and inductor 114. It will be appreciated that in other embodiments, electrical components may include typical analog and digital packaged devices such as resistors, capacitors, inductors, transistors, op-amps, LSI components, VLSI components and hybrids of analog and digital components. The foregoing list of devices is not exhaustive. It will be appreciated that in this art a substrate populated with any electrical component may be referred to as a circuit module and that a printed circuit board is also known as, simply, a circuit board.

Figure 1B:
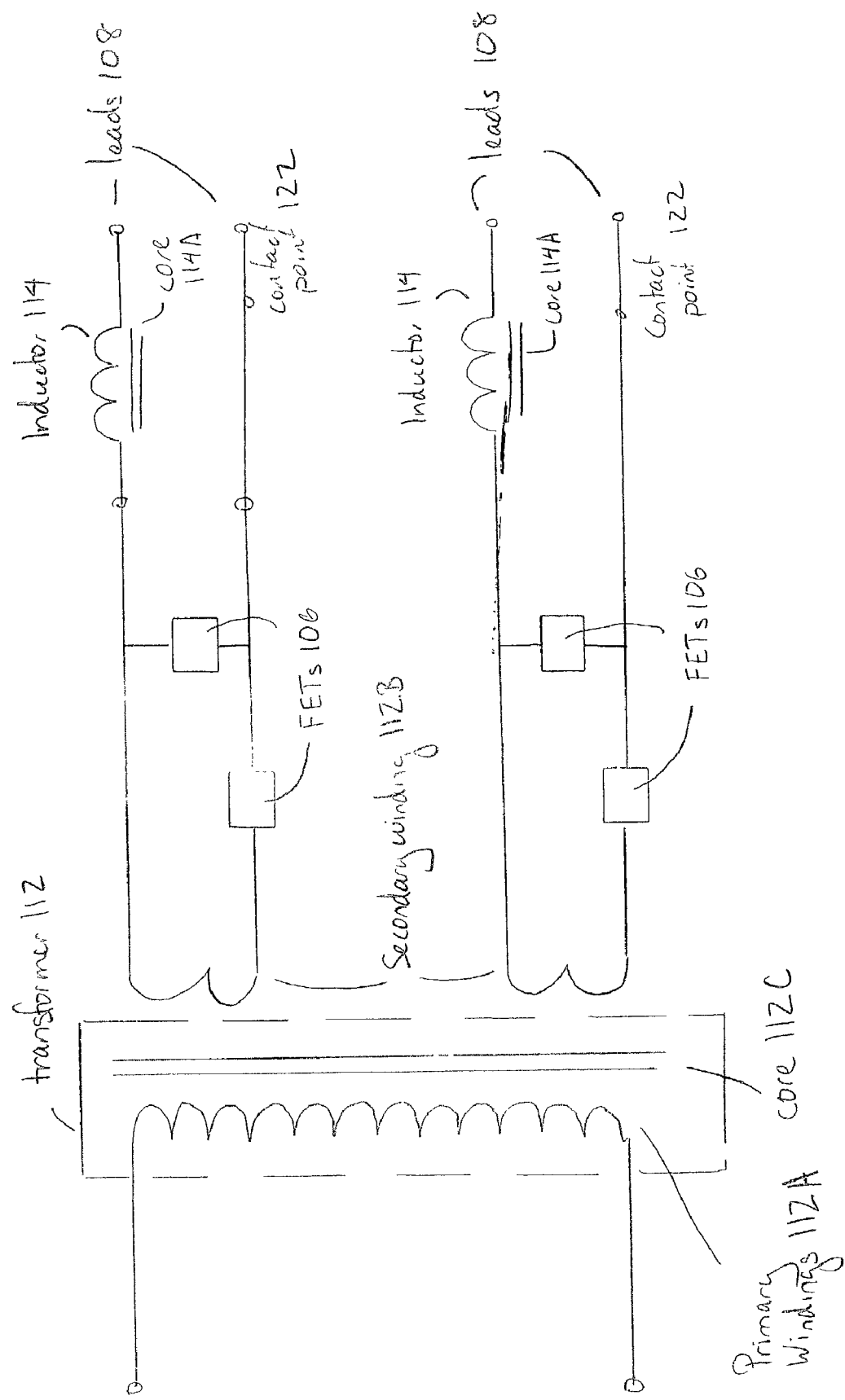
FIG. 1B is a schematic of a portion of a power conversion circuit of the power conversion module of FIG. 1A.

In the embodiment, power converter 100 generates a lower voltage, high current, power signal from a higher voltage, lower current, input voltage signal. Typical applications of the embodiment take a 24V signal and generate a 1.8V signal at 100 A. Other conversion applications can also be implemented. In the power conversion circuit in power converter 100, power (at 24V) is provided from a suitable power source. Power is provided to terminals (hidden in FIG. 1), which are similar to terminals 110, but are located at the back of PCB 104. Referring to FIGS. 1A and 1B, the input voltage signal is applied to the primary windings 112A of transformer 112. The primary windings are embedded in internal tracks in internal layers in PCB 104. The secondary winding 112B of transformer 112 is formed by a portion of substrate 102 which is encapsulated by core 112C of transformer 112 within its casing. The signal carried from the secondary 112B winding is regulated by FETs 106 and is then provided to inductor 114. Inductor 114 is formed by a part of substrate 102 which is encapsulated by core 114A contained casing 114B of inductor 114. The output of inductor 114 is the final output of power converter 100, and is provided to leads 108. Leads 108 are mountable into a power bus (not shown) and can be soldered into place.

It will be appreciated that transformer 112 and inductor 114 both belong to a family of signal transforming components which are known in the art as "magnetics". Magnetics typically have a winding such a winding 112A and 114A interacting with a magnetic core, such as 112C and 114B respectively. The main feature of a magnetic is the winding. Other variants on magnetics include having a winding which is associated with an air core. As such, for brevity, any general reference herein to transformer 112 and inductor 114 may use the term "magnetics", unless otherwise specifically noted.

When FETs 106 are powered, heat is generated. Heat may also be generated by PCB 104 and components mounted thereon, as well as, but to a lesser extent, by transformers 112 and 114. To remove heat from FETs 106 and PCB components 116, substrate 102 is adapted to encourage the dissipation of the heat. In particular, heat dissipation fins 118 are provided in substrate 102. In such a configuration, substrate 102 functions as a heat sink.

Referring to FIGS. 2A to 8, the manufacturing and assembly process of power converter 100 is described. First, substrates 102 and PCBs 104 are separately formed from separate blanks. Each blank contains a number of identical PCBs (and substrates) carried in a frame. Each PCB (and substrate) is populated with a set of its components. Fins 118 are then bent and formed in the substrate blanks. The blanks then are mated together and the individual PCBs and substrates 104 are excised from their frames.

Figure 2A:
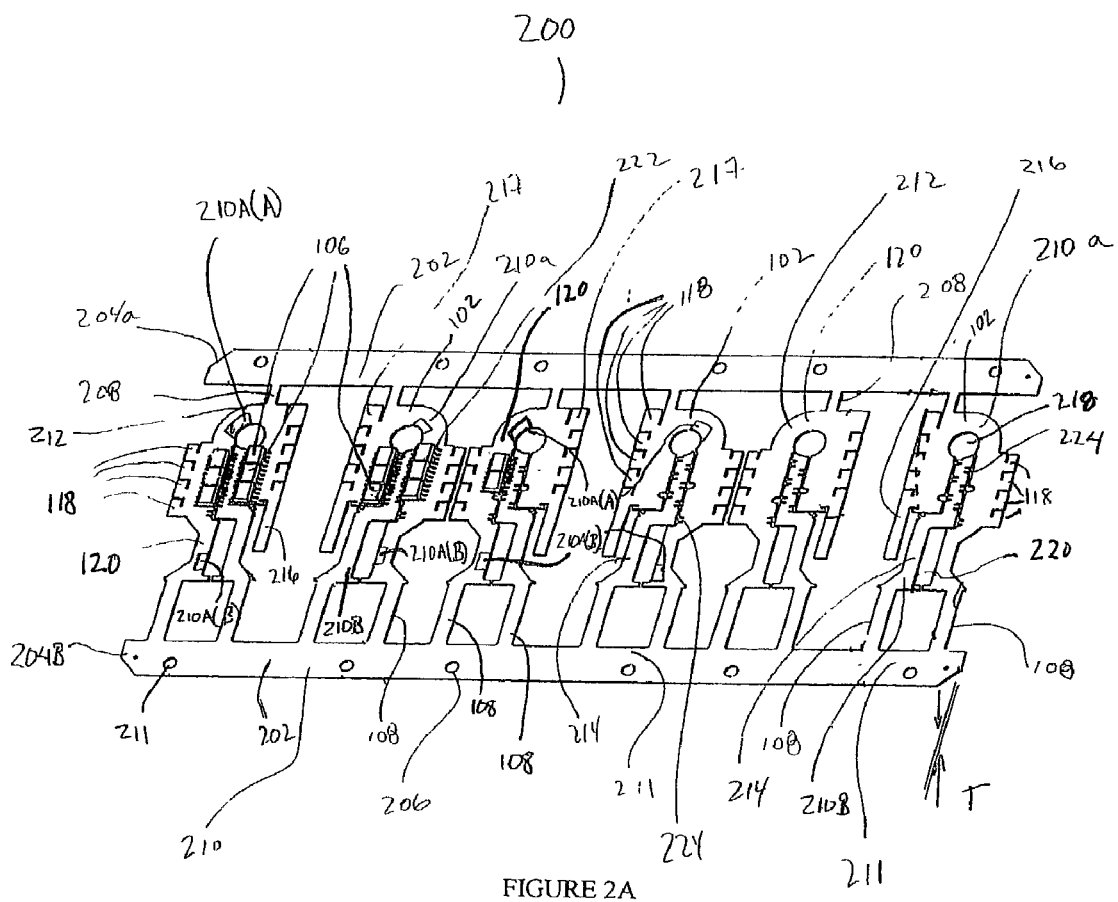
FIG. 2A is a perspective view of a lead frame of unformed, partially populated substrates of FIG. 1A.

Specifically referring to FIG. 2A, a blank, or web, in the nature of a lead frame 200, forms an array of substrates 102. Lead frame 200 shares some aspects with known lead frames. Known lead frame assemblies are used for manufacturing microelectronic components such as semi-conductors or integrated circuit chips. Such lead frame assemblies generally consist of a frame having sets of interior leads connected to the frame and a carrier. Generally, the frame is flat. An integrated circuit die is typically mounted upon the carrier. Electrical connections are made from the leads by fine electrically conductive bonding wires to locations on the circuit. Once the inner connections are made, the dies are encapsulated in a protective resin. The leads are then excised, and the integrated circuit is separated from the lead frame. External ends of the leads form the connection elements to connect the integrated circuit with other electronic components, such as electronic components mounted to a PCB.

Figure 5:
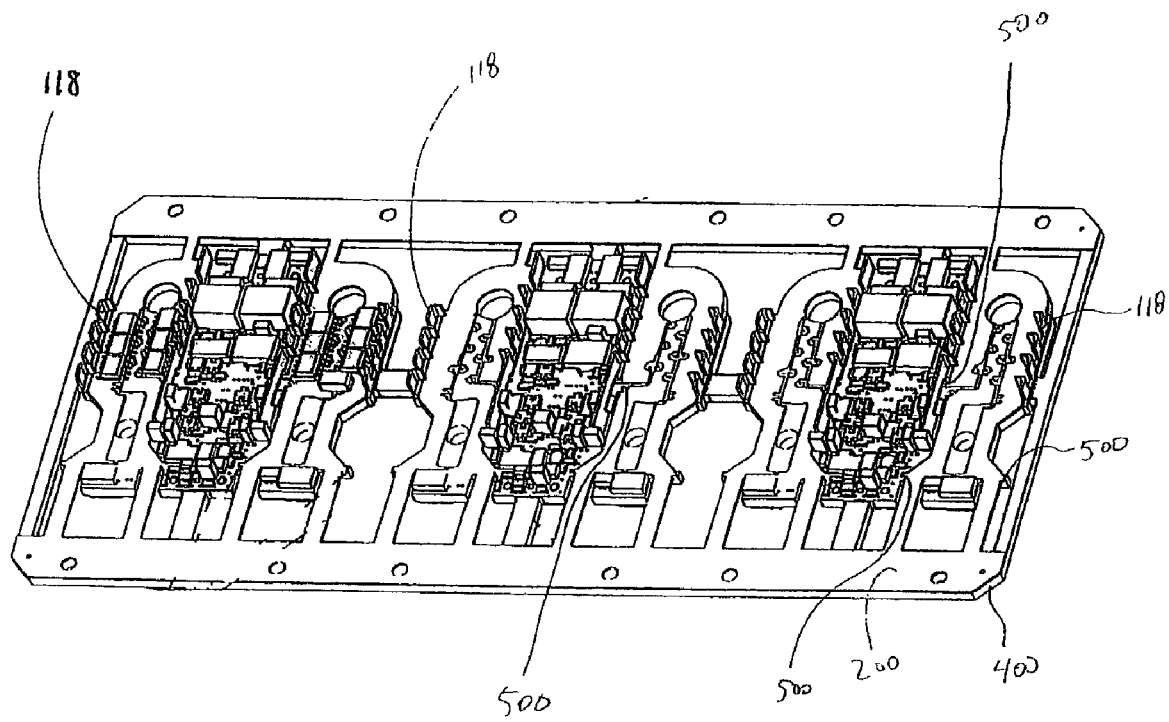
FIG. 5 is a perspective view of an assembly of the lead frame of FIG. 3B mounted to the blank of PCBs of FIG. 4.

For manufacturing efficiency, lead frame 200 includes three pairs of substrates 102. In the embodiment, lead frame 200 includes three pairs of aligned substrates 102 and substrates 120. This layout is set to align each substrate pair to be aligned with a corresponding PCB in PCB frame 400, as shown in FIG. 5. Substrates 102 are supported by a framework 202 which forms part of the lead frame 200. Framework 202 is mounted to or integrally formed with substrates 102, and serves to maintain substrates 102 in a predetermined orientation for later mounting to PCB 104. The term "framework" is used herein interchangeably with the term "frame". Again, in the embodiment, substrates 120 share similar physical and dimensional features of substrates 102, but for the layout of substrates 120 being a mirror image of substrates 102.

Lead frame 200 is preferably stamped from a single sheet of material such as a deformable and (electrically and thermally) conductive metal. Stamping is a relatively inexpensive manufacturing process. The sheet has a uniform thickness T to provide uniformity of substrates 102 which form a part thereof. In other embodiments, uniformity of the array may differ. In the embodiment, a bare copper sheet is used for lead frame 200. Other forming techniques maybe used to form lead frame 200 in other embodiments.

As is well known in the art, the amount and dimensions of copper used in a substrate affects the amount of electric current that can be carried by the substrate. As noted above, when portions of substrate 102 function as transformer windings, a significant amount of current may have to be carried. Accordingly, the cross-section dimensions and length of the copper sheet used for lead frame 200 is determined based in part on the amount of current to be carried. For example, as one component of the cross-section dimensions, for the substrate 102 as shaped, a thickness T of about 24 thousandths of an inch ("thou") will allow the substrate 102 to carry about 100 amperes, and a thickness T of about 12 thou will allow it to carry about 50 amperes. It is desirable to have a sufficient thickness to provide a cross-section which allows carrying of the amperage load of the related circuit. Other circuits may have lower amperage ratings of, for example, 5, 10, 15, 20 and 25 amps. While placing a relatively thick layer of copper on the surface of a PCB is possible, such an arrangement reduces the ability to provide fine track copper widths on the PCB surface. As such, SMT components, which generally are used with fine copper track widths, may not be efficiently placed on the PCB. Alternatively, burying the thick copper layer within the PCB does not allow effective dissipation of heat carried in the encapsulated copper layer, and will tend to reduce the number of substrate layers available for other design purposes.

Alternatively, depending on the particular function or functions to be performed by substrate 102, lead frame 200 may also be made of other material such as a ceramic, which is not necessarily electrically or thermally conductive. For example, substrate 102 may be used as a mere carrier for components without substrate 102 forming any direct electrical connection with PCB 104.

As noted above, lead frame 200 is stamped from a single sheet of material to form a generally planar blank having one or more substrates 102 and a framework 202 connecting and aligning the substrates 102. Framework 202 includes handling rails 204 or simply rails 204, for holding by, or engagement with, assembly machinery (not shown). In the embodiment, two generally parallel rails 204A and 204B are formed during the stamping process with substrates 102 defined therebetween. Rail 204A is connected to each substrate 102 via tabs 208, and rail 204B is connected to each substrate 102 by tabs which may be later formed into power leads 108.

Rails 204 may have one or more alignment elements in the nature of registers or mounting holes 206 defined therein. Mounting holes 206 permit the assembly machinery to engage lead frame 200 to facilitate alignment and mounting of lead frame 200 to a corresponding PCB frame 400 (see FIG. 4). In particular, one method of assembly and alignment of a PCB frame 400 to a lead frame 200 may be to use a base (not shown) having posts to co-operate with mounting holes in PCB frame 400 and lead frame 200. Accordingly, PCB frame 400 may be mounted onto the base by aligning the holes in the PCB frame 400 over the posts, then lead frame 200 may be mounted and aligned to PCB frame 200 in a similar manner. Accordingly, frame 200 may be referred to as an alignment frame.

Figure 6:
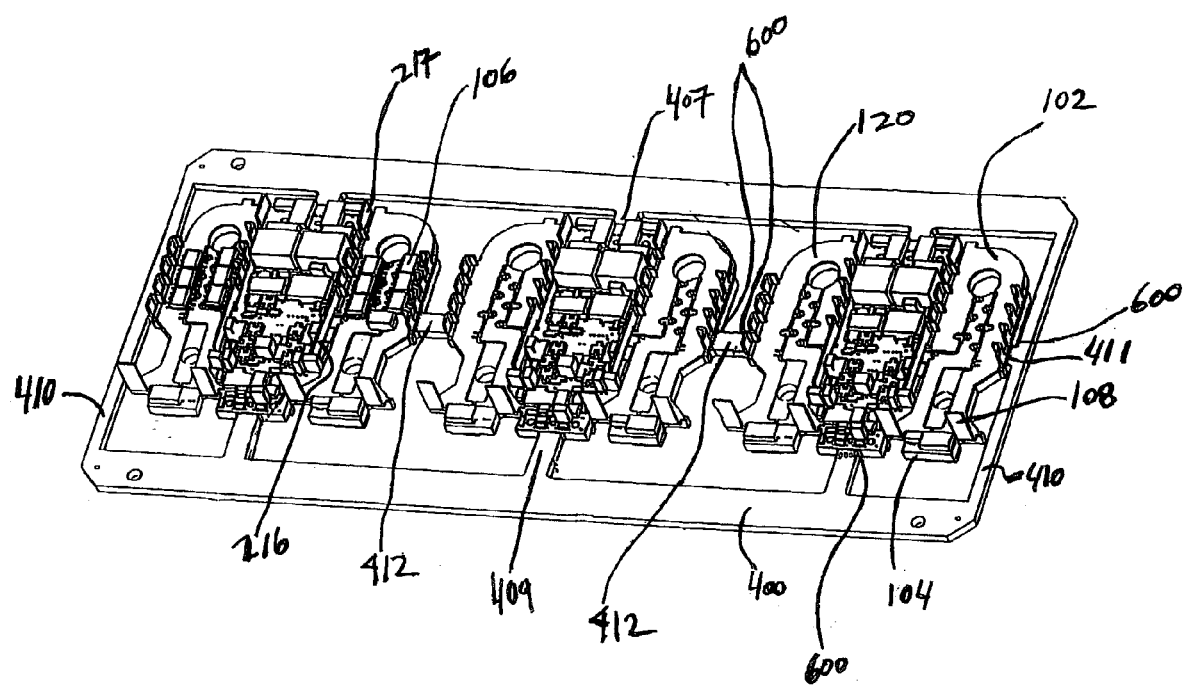
FIG. 6 is a perspective view of the assembly of FIG. 5 with handling rails of the lead frame removed.

The basic physical elements of each substrate 102 may be defined by the die of the stamp for the blank. As can be seen in FIG. 2, fins 118 are defined in the blank. When substrate 102 is made from a deformable, thermally conductive material, fins 118 can be bent upward from lead frame 200 to enhance the heat dissipation abilities of substrate 102. Excising and forming is done on lead frame 200 using techniques and tools known in the art. For example, a fin such as elongate fin 216 or elongate fin 217 may be formed in substrate 102. For increased transfer of thermal energy away from substrate 102, elongate fins 216 and 217 each have a greater surface area than fins 118. As shown in FIG. 6, elongate fins 216 and 217 also generally fit within the general volume otherwise occupied by power converter 100. The number of fins 118, 216 and 217 may also be varied to affect thermal transfer from substrate 102. While fins 118 are shown as being generally rectangular, other sizes and shapes may be applied depending on heat transfer requirements of power converter 100 and on physical space limitations of the intended application to which power converter 100 will be applied.

Power leads 108 also serve to dissipate heat from power converter 100. Even if fins 118, 216 and 217 or power leads 108 are not included with substrate 102, the substrate 102 itself, when made of a thermally conductive material, can draw heat away from FETs 106. Further still, if substrate 102 is not made of a thermally conductive material, it may still be configured to perform any one or more of the other functions described herein.

Substrate 102 has a first portion 210A and a second portion 210B, each of which is initially physically isolated from the other by a space except for a lead frame rail section 211 therebetween (this section 211 is removed with rails 204 in a later stage of manufacture). Substrate portions 210A and 210B co-operate to define an opening 218, for receiving a transformer core (not shown) of transformer 112, and an opening 220, for receiving a core (not shown) of inductor 114. Other shaped spaces, gaps and openings may be provided in other embodiments by differently shaped first and second portions of substrate 102 for alternative design, heat transfer or component placement requirements.

As indicated earlier, substrate 102 forms one secondary winding 112B for transformer 112. The section of substrate 102 which forms winding 112B is indicated at section 210A(A). Similarly, the section of substrate 102 which forms winding 114B of inductor 114 is shown at section 210A(B). Accordingly, substrate 102 is an active part of the power conversion circuit of power conversion module 100. It will be appreciated that in other embodiments, a substrate similar to substrate 102 may be incorporated into a different electrical circuit and that the substrate may have different electrical components attached thereto.

After the lead frame 200 is stamped, it may be placed for processing onto assembly machinery such as a conveyor system. Alternatively, lead frame 200 may be processed manually. Whether processed manually, using an automated system, or some combination thereof, lead frame 200 is then populated with FETs 106. However, it will be appreciated that more manufacturing efficiencies will be possible, generally, with an automated manufacturing procedure. Lead frame 200 advantageously permits direct component attachment using existing machinery, whether the components are encapsulated or not. When substrate 102 is attached or mounted to PCB 104, it effectively increases the surface area of PCB 104 so that the number of components, such as FETs 106, that can be attached to PCB 104 is increased while not changing a footprint of the PCB. When populated in this manner, substrate 102 functions as an external, exposed circuit to PCB 104. In the embodiment, FETs 106 are populated onto the lead frame 200 using known surface mount technology ("SMT") component populating and soldering techniques. As described above, lead frame 200 also has alignment elements enabling the lead frame 200 to be aligned with a corresponding set of PCBs in a corresponding PCB frame, to facilitate manufacturing and assembly of the PCB and its components. When FETs 106 are soldered onto lead frame 200, FETs 106 are rigidly connected to the lead frame, allowing FETs 106 to be securely attached to the lead frame, regardless of the spatial orientation of FETs 106 relative to the lead frame. For example, FETs 106 may be mounted on an underside of a substrate.

Figure 3B:
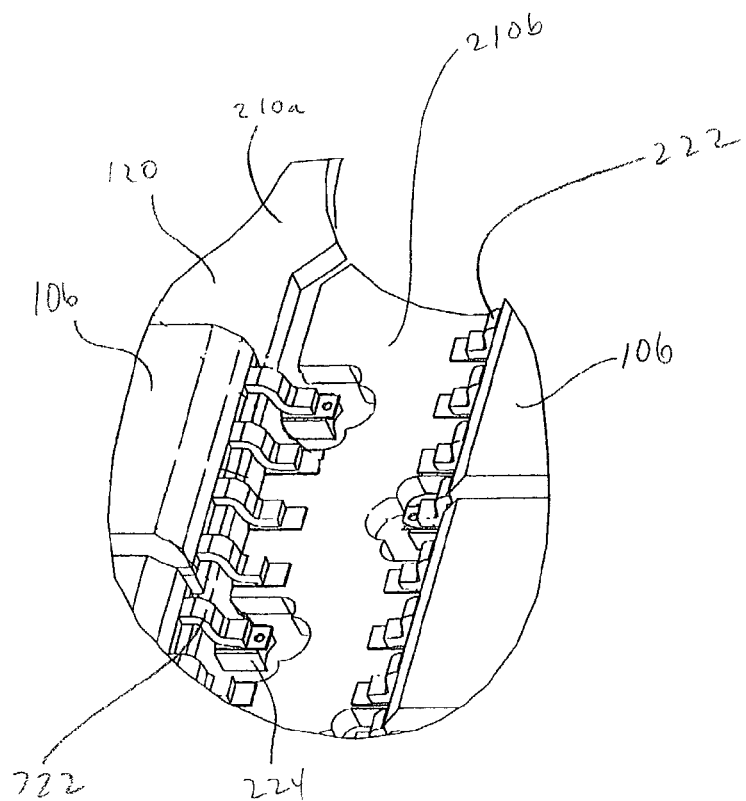
FIG. 3B is an exploded view of the lead frame of FIG. 2B illustrating excised portions of a substrate of FIG. 2B.
Figure 3A:
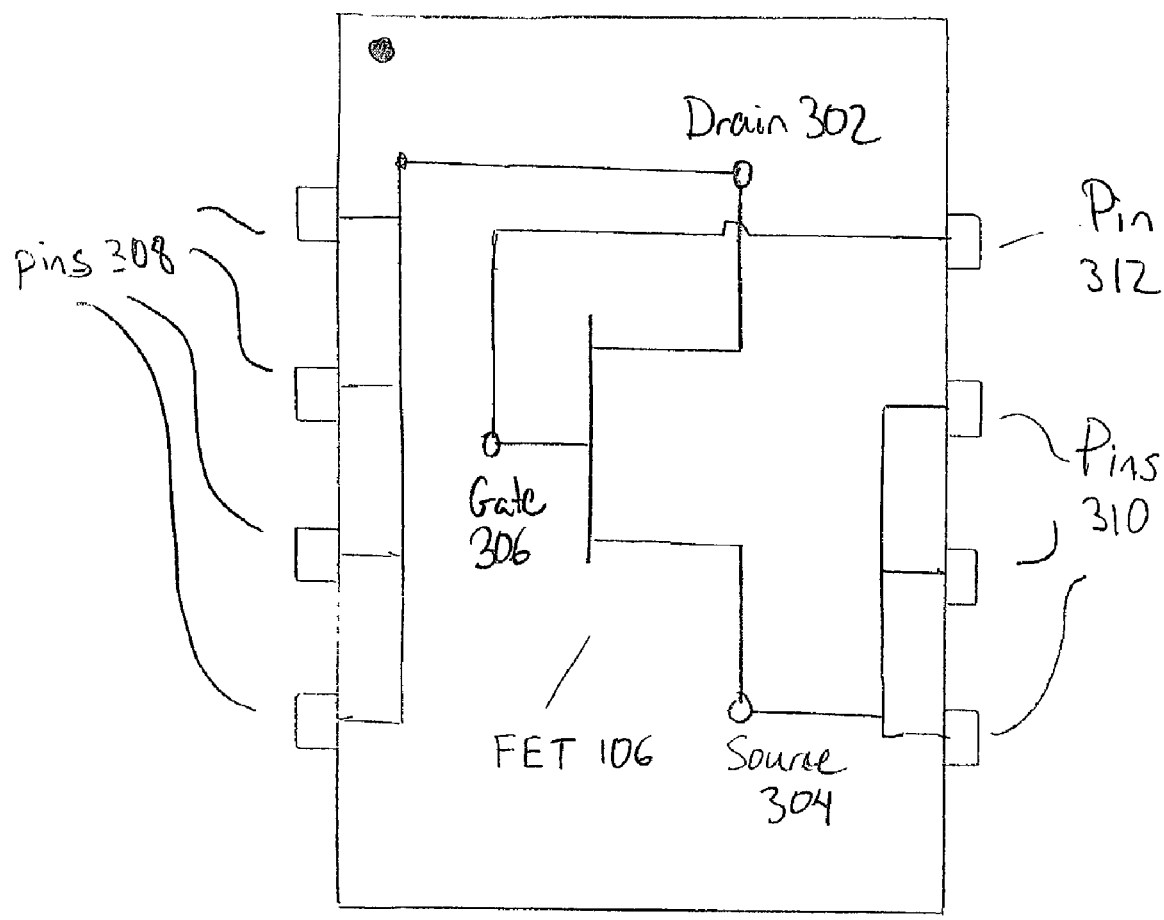
FIG. 3A is a schematic diagram of a SMT package of a FET used in the power conversion module of FIG. 1A.

Referring to FIG. 3A, FETs 106 are each embodied in a typical SMT S08 package 300. An exemplary FET 106 comprises a drain terminal 302, a source terminal 304 and a gate terminal 306. FET 106 operates as per known FETs. Within S08 package 300, drain terminal is connected to pins 308, source terminal 304 is connected to pins 310 and gate terminal is connected to pin 312. As described in greater detail below, nib 224 is later excised from substrate 102 to electrically isolate the associated pin 312 from its previously attached substrate portion 210A or 210B, as the case may be. The remaining pins 308 and 310 on either side of SMT package 300 of FET 106 remain connected to substrate portion 210A or 210B (depending on the side of FET 106 that the leads 222 are associated with). Accordingly, pins 308 are electrically shorted together on either side of substrate portions 210A and 210B and pins 310 are also electrically shorted together on either side of substrate portions 210A and 210B. When FETs 106 are mounted to substrate 102, they are located to having their pins bridge substrate portions 210A and 210B. Each pin 308, 310 and 312 makes physical and electrical contact with a landing and are soldered, bonded or otherwise fixed to landings on substrate 102. Substrate 102 is also formed to include nib 224 for connection to pin 312 of package 300 of FET 106.

FET 106 straddles substrate portions 210A and 210B. This configuration permits a circuit to be completed between portions 210A and 210B via the contacting pins of FETs 106 when populated substrate 102 is mounted to a PCB 104. As a result, substrate 102 forms part of an operable circuit in addition to forming part of the windings of transformer 112. Accordingly, substrate 102 with mounted FET 106 may be considered to be a circuit module. Alternatively, if substrate 102 is not populated with FETs 106, substrate 102 may still form a portion of a circuit when combined with PCB 104. It will be appreciated that for a given circuit configuration and a given lead layout for a FET 106 (or other component), the arrangement of leads which are attached to the portions, and those which are excised, vary depending on the circuit.

Figure 2B:
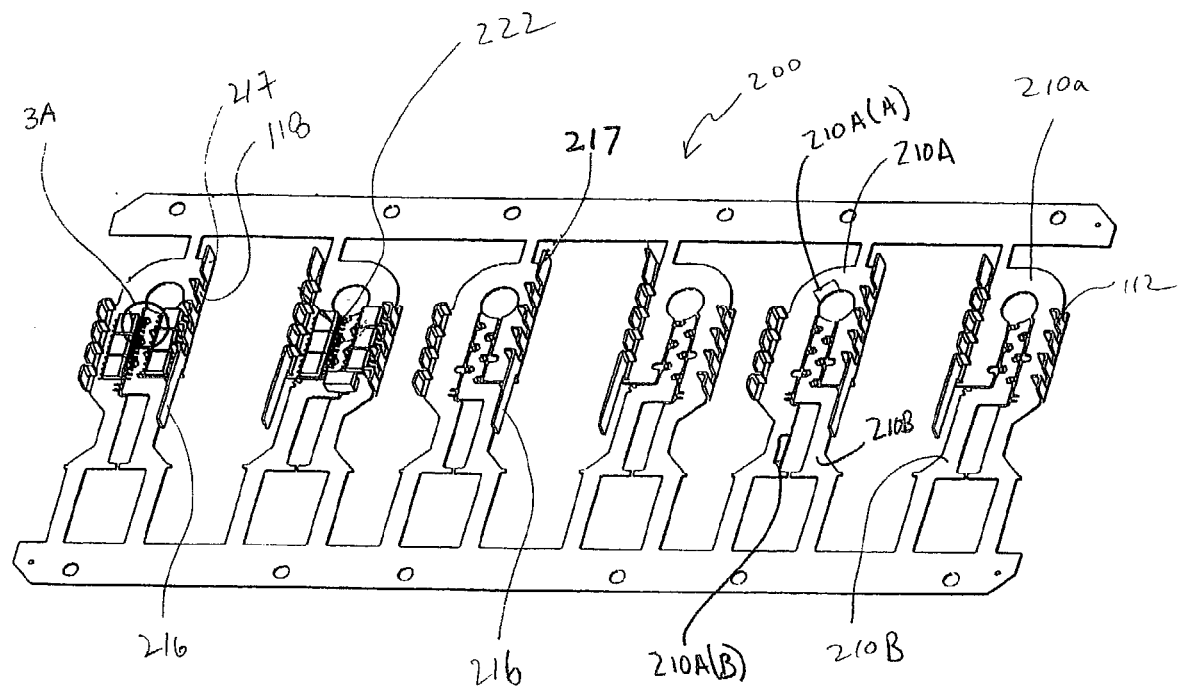
FIG. 2B is a perspective view of the lead frame of FIG. 2A after excising and forming.

Referring to FIG. 2B, the lead frame 200 of FIG. 2A is shown after it has been excised and formed. Fins 118 are bent from the plane of lead frame 200 so that they are oriented generally perpendicular to the plane of lead frame 200, and are generally oriented in the same direction. Fins 118 are preferably oriented away from the side of lead frame 200 which will be mounted to PCB 104. This configuration encourages the dissipation of thermal energy away from substrate 102 and PCB 104 (when PCB 104 is mounted to substrate 102). Elongate fins 216 and 217 may be similarly bent. The fins, for example fins 118, may be bent at a second location to locate at least a portion thereof closer to the components, for example FETs 106, from which thermal energy is to be drawn (see also FIG. 5).

Referring additionally to FIG. 3A, nibs 224 are excised from substrate 102 to isolate attached FET lead 222 from associated portion 210B. Excising may be done by using a punch tool (not shown) to sever nib 224 from substrate 102. Alternatively, substrate 102 may be trimmed or drilled therethrough in a location adjacent each nib 224. Any other suitable method as is known in the art may also be used to excise nib 224 from substrate 102.

While nib 224 is excised from substrate 102 it is still attached on one side to a FET lead 222. The other side of nib 224 will be aligned and soldered to a land 402 (see FIG. 4) of PCB later in the manufacturing process. When substrate 102 is mounted to PCB 104, excised nib 104 functions as a riser and serves to span the space between FET lead 222 and land 402, thereby electrically connecting FET 106 to PCB 104. This structure may similarly be used to connect PCB 104 to other components (not shown) which are mounted to substrate 102, in order to create a conductive interface between substrate 102 and PCB 104.

Alternatively, components such as FETs 106 which are mounted to substrate 102, may have a particular lead thereof electrically connected to PCB 104 by using an extended leg (not shown) that is dimensioned to span the distance between FET 106 and PCB 104. If this configuration is employed, then a pathway or void (not shown) defined by substrate 102 is located for each extended leg to pass therethrough for connection to PCB 104. In a further alternative (not shown), a conductive material, such as solder or a post, may be added to FET lead 222 so that it may span thickness T of substrate 102 to electrically connect to PCB 104. If solder is used, then sufficient solder material should be provided to ensure that after reflow there is enough solder to form an electrical connection between FET 106 and PCB 104.

Figure 4:
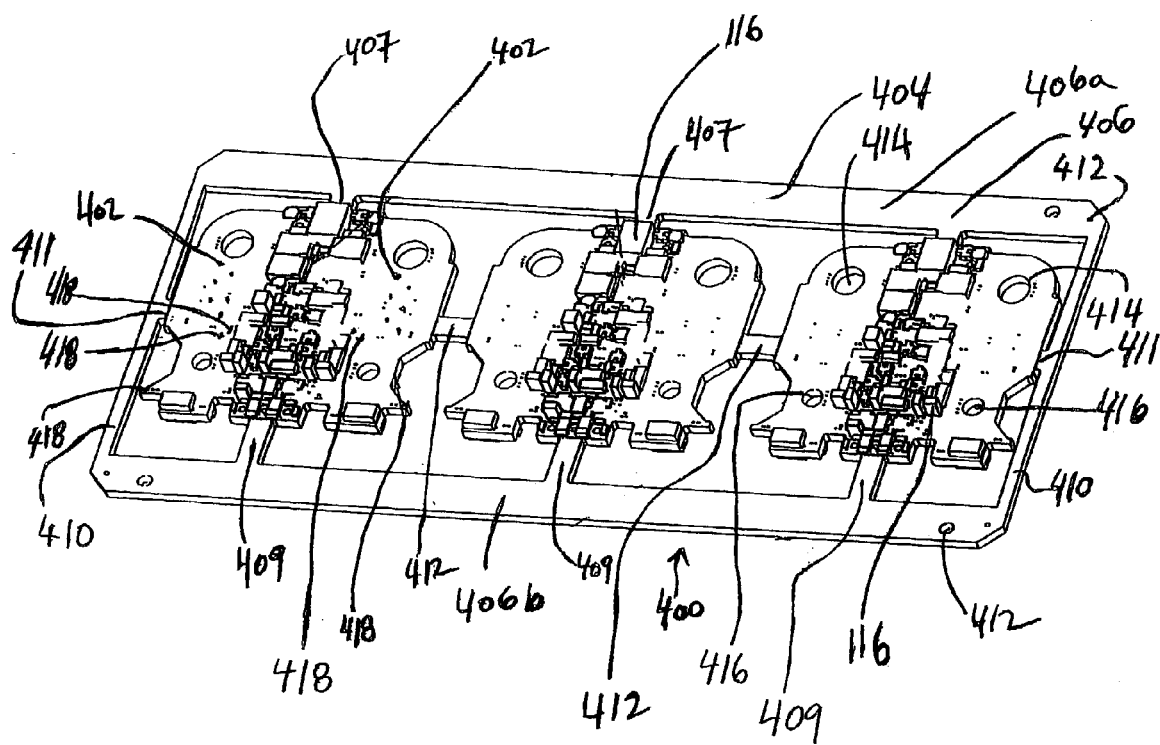
FIG. 4 is a perspective view of a blank of partially populated PCBs from which the PCB of FIG. 1A is provided.

Referring to FIG. 4, a blank or web in the nature of a PCB frame 400 is used to form PCB 104. For manufacturing efficiency, PCB frame 400 includes multiple PCBs 104. In the embodiment, PCB frame 400 includes three aligned PCBs 104. This configuration permits each PCB 104 to be aligned with a corresponding lead frame 400, as shown in FIG. 5. PCBs 104 are supported by a framework 404 which forms part of the PCB frame 400. Framework 404 is mounted to or integrally formed with PCBs 104, and serves to maintain PCBs 104 in a predetermined orientation for later mounting to substrate 102.

PCB frame 400 is preferably manufactured as a single part including PCBs 104. Any appropriate PCB manufacturing process known in the art may be used. A preferred configuration of PCB frame 400 permits multi-layer PCBs 104 to be manufactured using such processes as are known in the art. Once PCB frame 400 is manufactured, it is populated with PCB components 116. Preparation of PCB frame 400 may be carried out using known manufacturing equipment and methods, including those which employ surface mount technology.

PCB framework 404 has rails 406 for holding by, or engagement with, assembly machinery (not shown). Two generally parallel rails 406a and 406b are formed during the PCB framework manufacturing process, with PCBs 104 located therebetween. Rail 406a is connected to each PCB 104 via tabs 407, and rail 406b is connected to each PCB 104 by tabs 409. Spanners 410 connect rails 406a and 406b. Transverse tabs 411 connect spanners 410 to adjacent PCBs 104. A spanner 410 is located at either end of PCB framework 404. Additional transverse tabs 411 form interconnections between adjacent PCBs 104 of PCB framework 404.

Rails 406 have one or more mounting holes 412 defined therein. Mounting holes 412 permit the assembly machinery to engage PCB frame 400 to facilitate alignment and mounting of PCB frame 400 to a corresponding lead frame 200.

Each PCB 104 has portions defining openings 414 for receiving a transformer core (not shown) of transformer 112, and openings 416 for receiving a transformer core (not shown) of transformer 114. Windings (not shown) are sandwiched within each PCB and encircle openings 414 and 416. Each winding of PCB 104 co-operates with a respective winding of the magnetics of transformer 112 and inductor 114, as noted earlier.

Referring to FIG. 5, excised and formed lead frame 200 is mounted by soldering to PCB frame 400. Lead frame 200 has portions in the nature of nubs 500 which align with lands 418 of PCB 104 (see FIG. 4; lands 418 are obscured by nubs 500 in FIG. 5). An electrical connection is made between PCB 104 and substrate 102 at nubs 500 by soldering substrate 102 to PCB 104. Contact points for nibs 500 for substrate 102 are shown points 122 in FIG. 1A. In the embodiment, points 122 are internally connected via a track in PCB 104. Lead frame 200 may be attached directly to PCB frame 400 using a PCB reflow process known in the art. Alternatively, the lead frame 200 and PCB frame 400 may be attached using a secondary attach process using a thermal bar or hand solder process.

It will be appreciated that when substrate 102 is soldered to PCB 104, substrate 102 may lie generally flush against PCB 104. Due to manufacturing tolerances, design requirements and other reasons, there may be an air gap between the upper surface of PCB 104 and the lower surface of substrate 102. As assembled, heat produced by PCB 104 is conducted through substrate 102 and any components thereon. Accordingly, the surface area of substrate 102 and any components thereon is used to dissipate heat from PCB 104. Air flow around the exposed surface of substrate 102, either forced, convection or ambient, may assist in dissipation of heat from substrate 102.

Frameworks 202 and 404 co-operate to facilitate the alignment of associated substrates 102 to PCBs 104. Once aligned, substrates 102 and PCBs 104 may be physically and/or electrically connected together. If either or both of substrate 102 and PCB 104 are not populated with components, the lead frame 200 and PCB frame 400 may still be mounted to one another in the manner described above. In this way, frameworks 202 and 404 still facilitate alignment of the associated substrates 102 and PCBs 104 for mounting.

As noted earlier, whether or not substrate 102 and PCB 104 are populated with components, lead frame 200 and PCB frame 400 are mounted generally flush to one another. In an alternative embodiment, lead frame 200 may have a raised section to form a spaced region when mounted on PCB frame 400, as described below and shown in FIGS. 9A and 9B.

Referring to FIG. 6, the combined lead frame 200 and PCB frame 400 is shown with lead frame rails 204 and tabs 208 removed. Lead frame rails 204 and tabs 208 may be removed at this stage in the assembly of power converter 100 because substrate 102 and PCB 104 are attached. Also, at this stage in the assembly process, lead frame leads 108 are formed or bent for convenient connection to a power supply (not shown). In the embodiment, leads 108 are angled away from PCB 104 and are generally perpendicular to the plane thereof.

Once frame rails 204 are removed and power leads 108 are formed, PCB 104 is detached from PCB framework 404 either by cutting, breaking, or in some other manner separating it from PCB framework 404 without damaging power converter 100. For example, PCB framework 404 may have small holes or perforations 600 defined therein to facilitate separation of PCB 104 from PCB framework 404. Perforations 600 traverse tabs 407, 409, 411 and 412, adjacent each PCB 104, for removal of tabs 407, 409, 411 and 412, and associated rails 406 and spanners 410.

Figure 7:
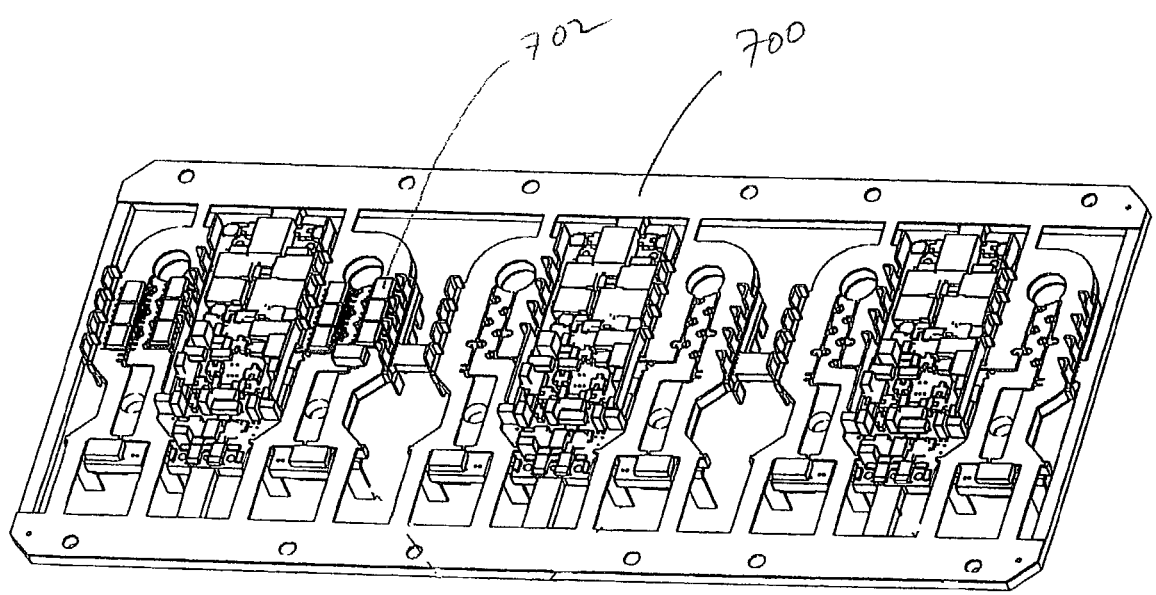
FIG. 7 is a perspective view of the assembly of FIG. 6 having a second lead frame mounted thereto.

Referring to FIG. 7, as an alternative, before detaching PCB 104 from PCB framework 404, a second lead frame 700 is mounted to PCB framework 404 on a side thereof which is opposite to lead frame 200. The addition of a second lead frame 700 permits further implementation of one or more of the features described above for lead frame 200 and its associated substrates 102. For example, second lead frame 700 may be used to encourage further heat dissipation from PCB 104, substrate 102 and associated components thereof. Second lead frame 700 may also be populated with components, such as FETs 702, in a similar manner as described above for lead frame 200.

Figure 8:
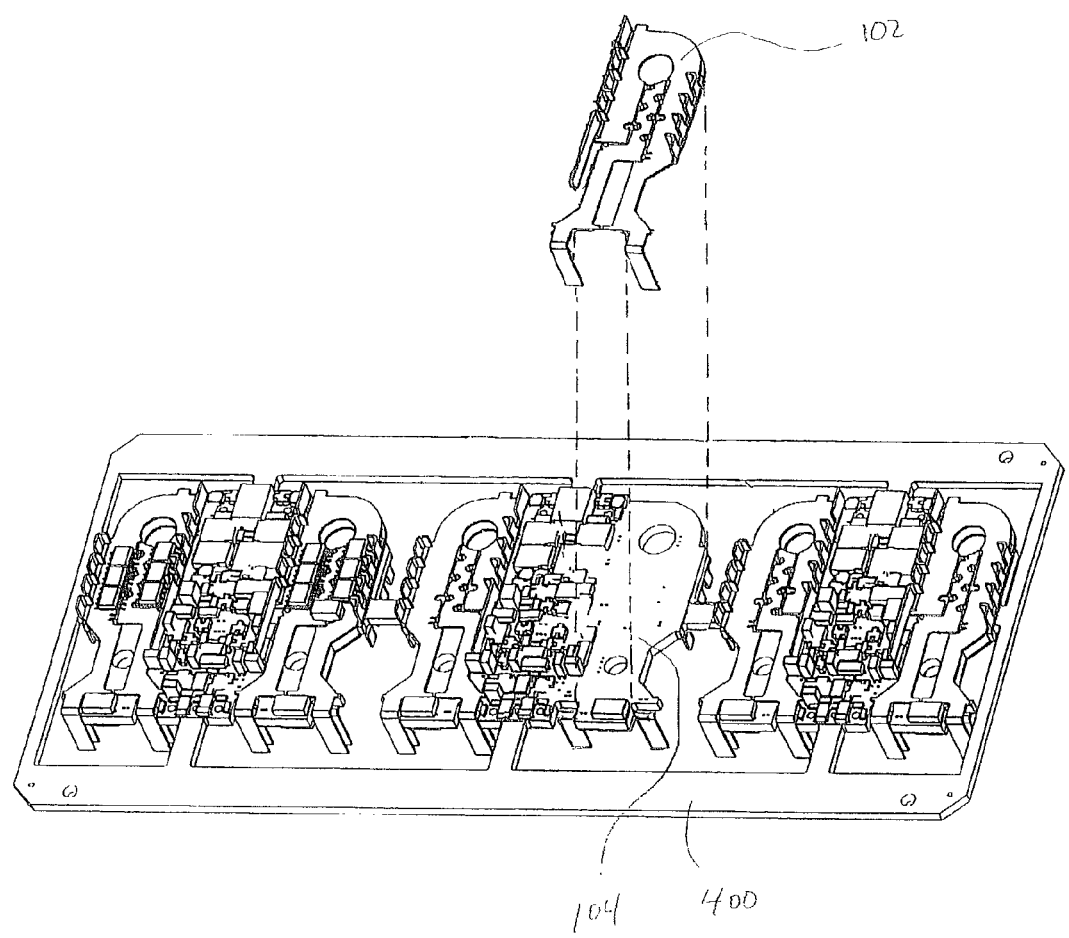
FIG. 8 is a perspective view of the assembly of FIG. 7 with the second lead frame removed, and a substrate shown in exploded view.

Referring additionally to FIG. 8, second lead frame 700 is excised and formed in a manner similar to that described for lead frame 200. Once excising and forming is complete, additional components, such as cores and casings for transformer 112 and inductor 114, are mounted to substrate 102 and PCB 104. Power converters 100 are then detached from PCB frame 400 as described above for the embodiment having a single lead frame 200. This results in the isolation of a completed power converter 100, as shown in FIG. 1A.

For illustrative purposes, FIG. 8 shows an isolated completed, but unpopulated substrate 102, in exploded view from PCB 104.

Figure 9B:
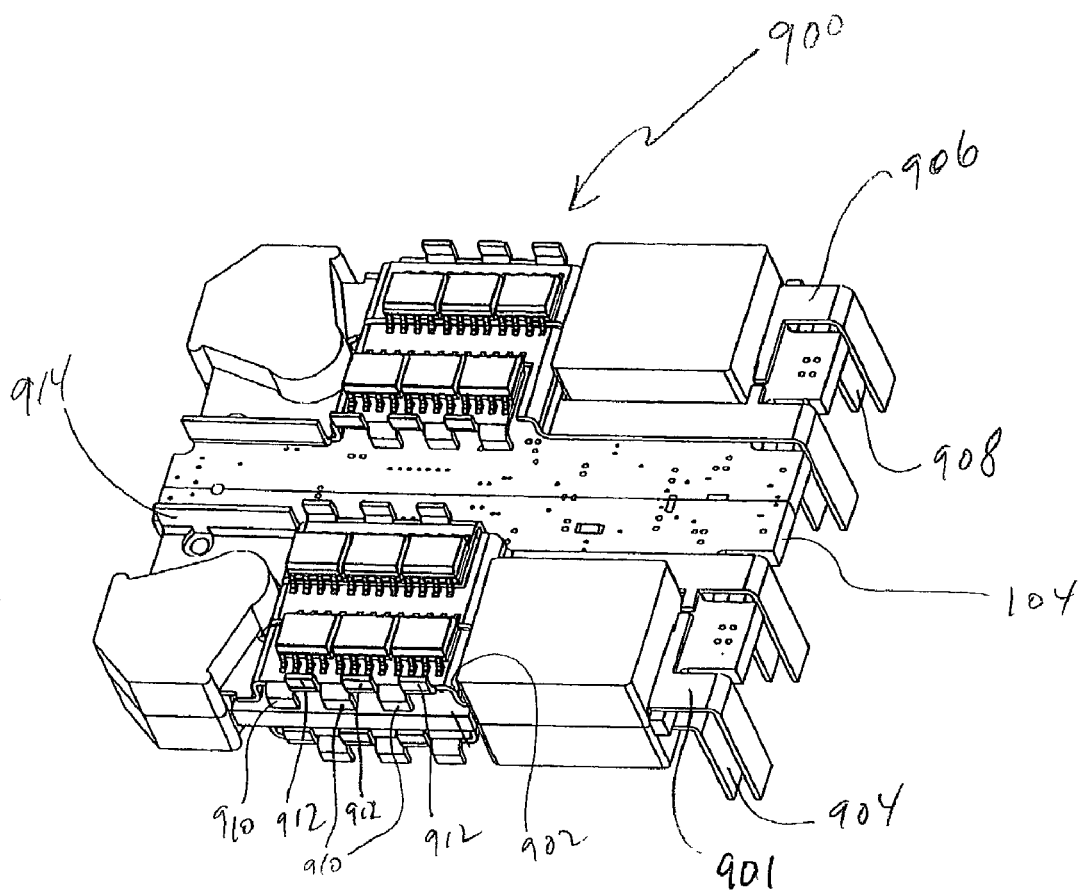
FIG. 9B is a side view of the assembly of FIG. 9A.
Figure 9B:
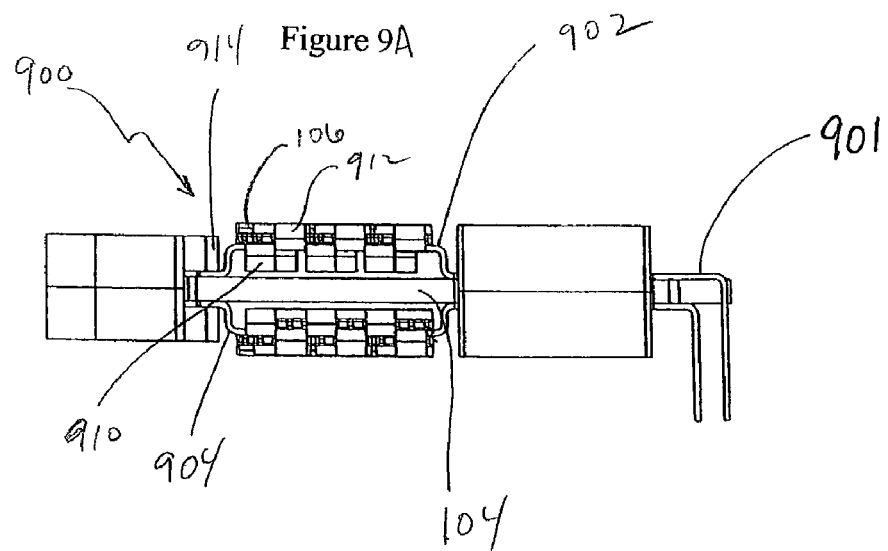

Referring to FIGS. 9A and 9B, an alternative power converter 900 is shown. Alternative power converter 900 differs from power converter 100 in that it has a modified substrate 901 mounted to a side of PCB 104. Substrate 901 has an offset or raised section 902 that, when mounted to PCB 104, is spaced from PCB 104. Substrates 904, 906 and 908 are similarly configured. Because substrates 901, 904, 906, and 908 have similar configurations, only substrate 901 will be described. The description herein for substrate 901 generally applies to substrates 904, 906, and 908 as well.

Raised sections 902 can be post-formed either when lead frame 200 is initially stamped or at some stage in the manufacturing process thereafter. Following forming, which deforms substrates 102 into substrates 901, substrates 901 are populated, processed and mounted to PCB frame 400 in a similar manner as described above for substrates 102.

Raised section 902 presents two sides for mounting electronic components such as FETs 106. This enables a greater number of components to be used in roughly the same footprint as occupied by power converter 100. Additional components may also be added to PCB 104. Raised sections 902 increase the exposed surface area of both substrate 901 and PCB 104. This increased exposure may facilitate the transfer of heat from PCB 104, substrate 901 and their associated components. In a manner similar to that used to create fins 118, 216 and 217, fins 910, 912 and 914 may be created. Fins 910, 912 and 914 encourage transfer of heat away from power converter 900. Fins 910 and 912 may be bent to opposite sides of substrate 901 to facilitate air flow therebetween. In the embodiment illustrated, fins 910 and 912 alternate along an edge of raised section 902.

As an alternative to raised section 902, substrate 901 may instead be displaced from PCB 104 using risers (not shown) or some other means to produce a space between PCB 104 and the lower surface of substrate 102, to allow placement of components to the underside of substrate 901, and to enhance heat dissipation for power converter 900.

Figure 10:
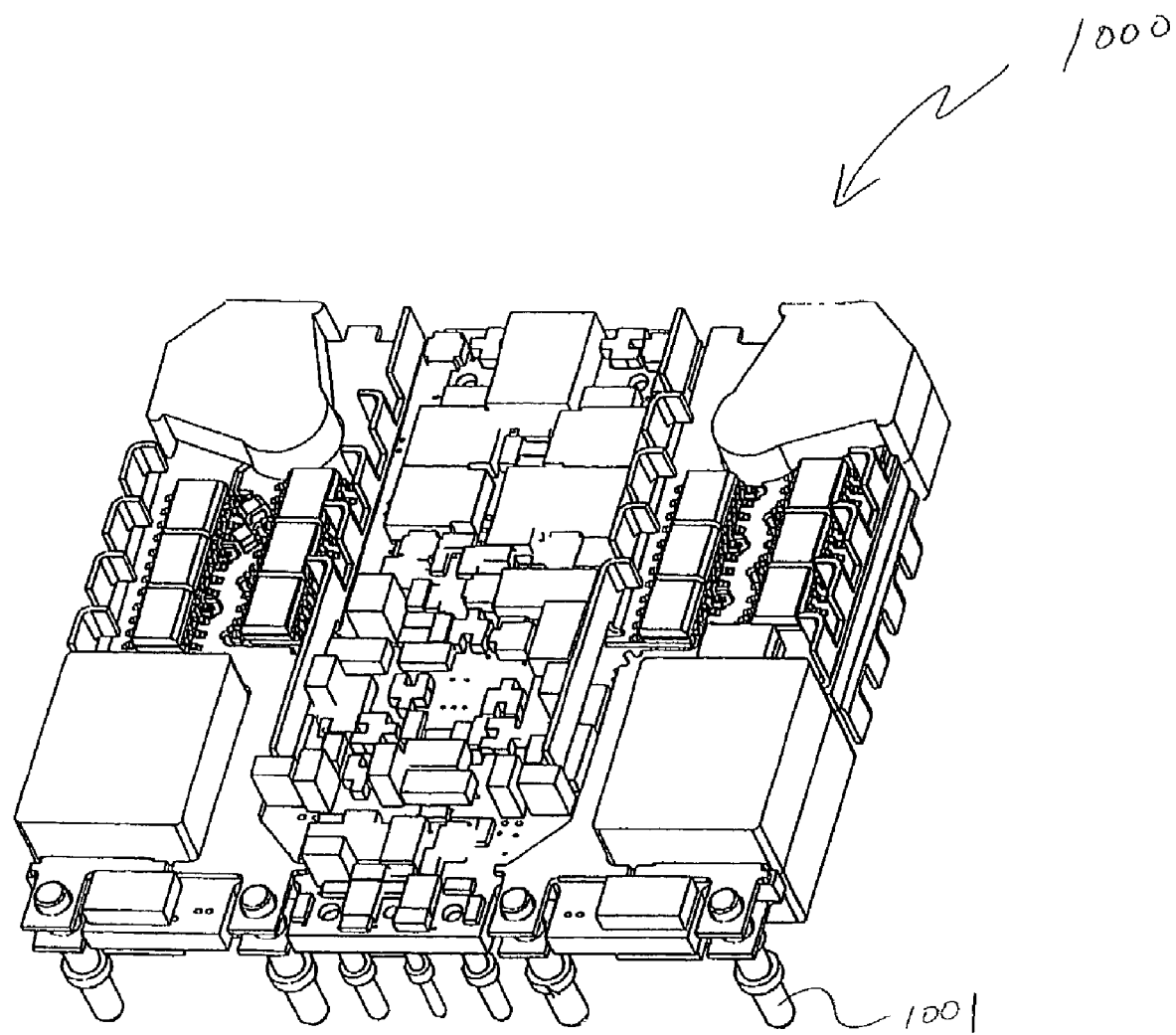
FIG. 10 is a perspective view of a variation of the assembly of FIG. 1A wherein interconnect pins are used.

Referring to FIG. 10, alternative power converter 1000 is shown. Power converter 1000 is similar to power converter 100 except that it has interconnect pins 1001 attached instead of power leads 108. As described above, while the use of power leads 108 can increase the current carrying capabilities of power converter 100, if power requirements are such that less current is acceptable, then interconnect pins 1001 may be used instead of power leads 108.

Figure 11:
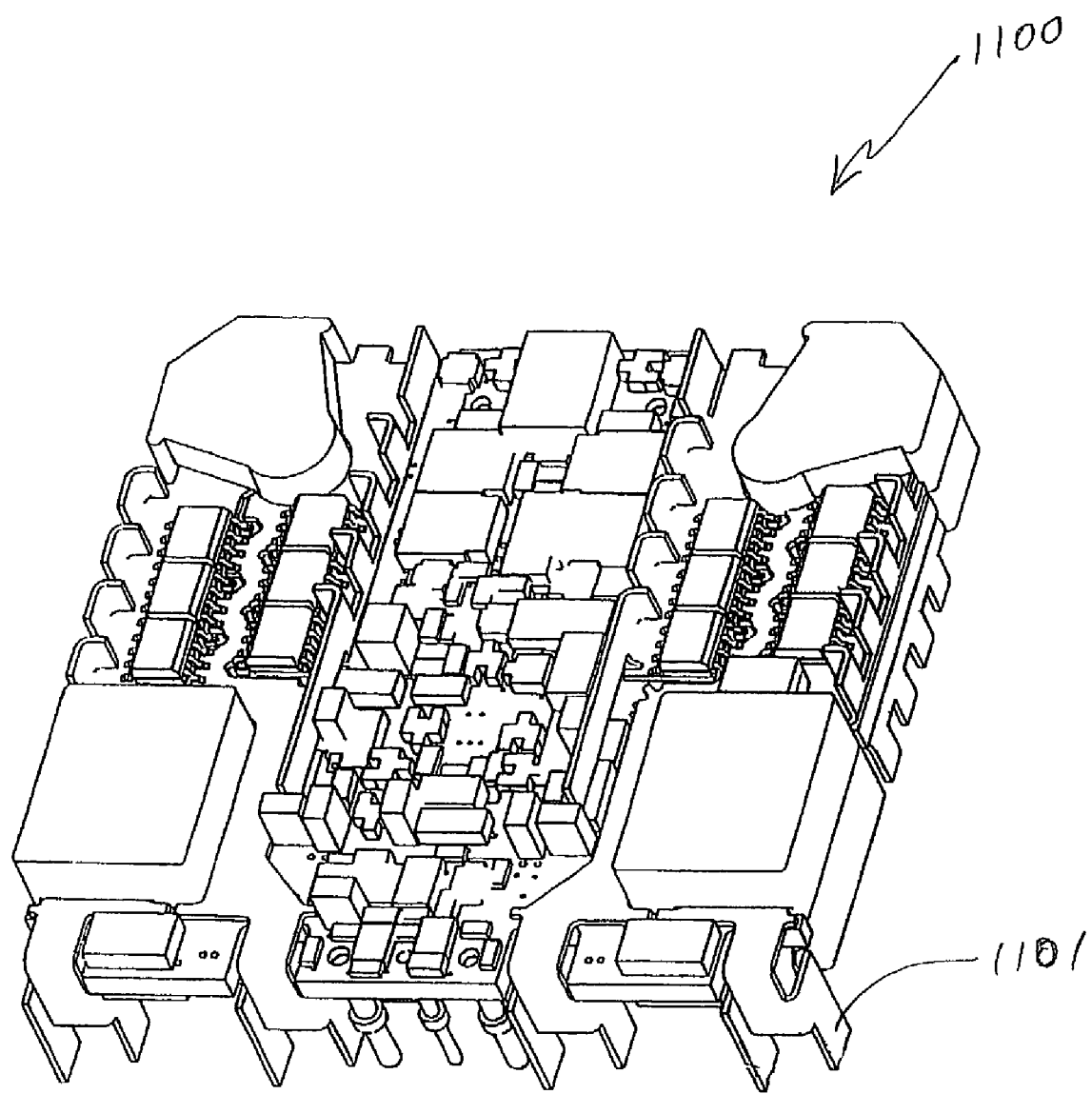
FIG. 11 is a perspective view of another variation of the assembly of FIG. 1A wherein extended tabs are rotated.

Referring to FIG. 11, alternative power converter 1100 is shown. Power converter 1100 is generally similar to power converter 100, but it differs in that the orientation of power leads 108 is rotated to form power leads 1101. This configuration of power leads 1101 permits attachment to a power supply (not shown) having a different configuration than the power supply for power converter 100.

Figure 12:
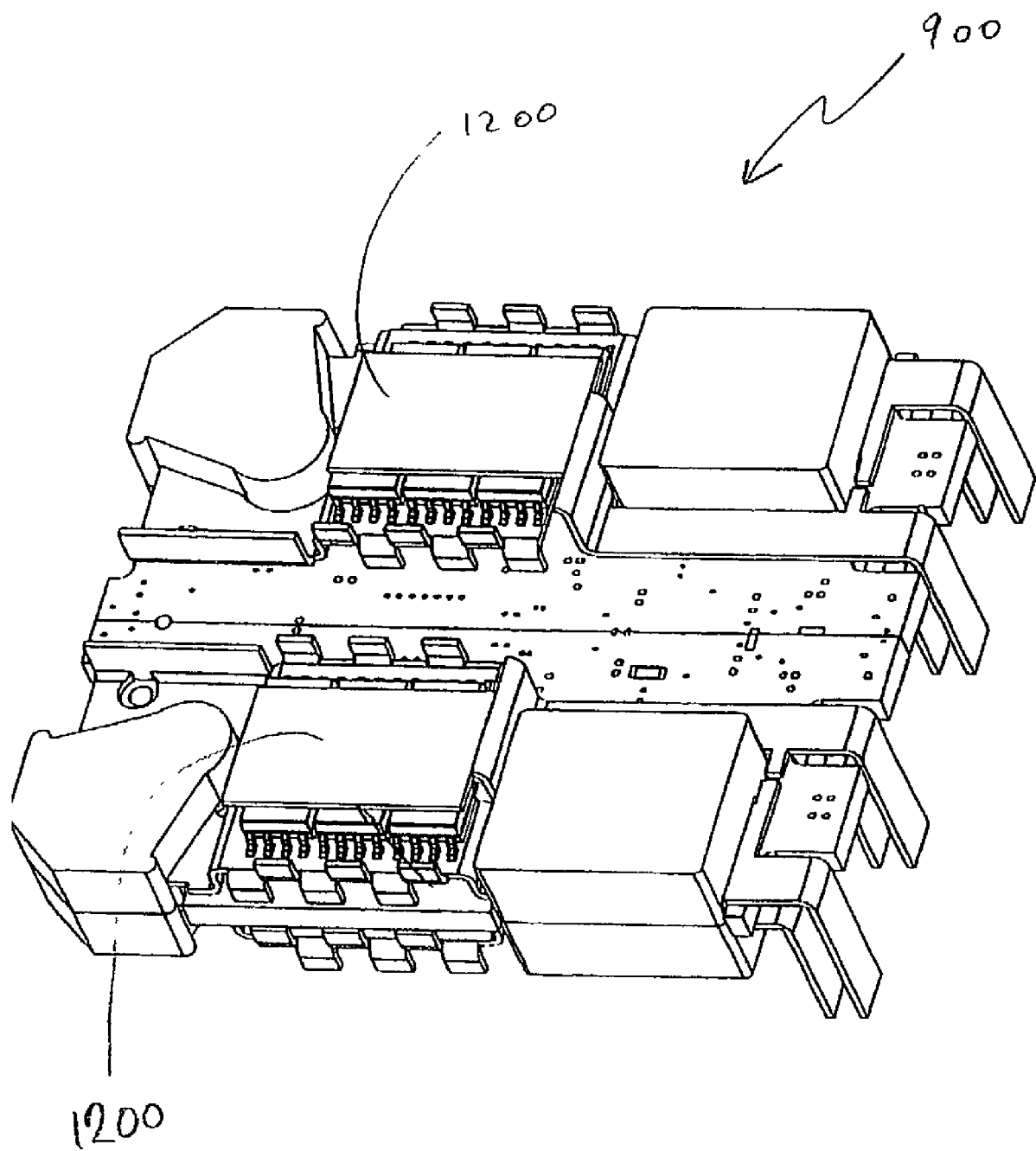
FIG. 12 is a perspective view of the assembly of FIG. 9A having an additional substrate mounted to the substrate.

Referring to FIG. 12, power converter 900 is shown having an additional substrate 1200 provided therewith. Additional substrate 1200 is formed from a generally planar piece of a thermally conductive material, and has a different configuration than substrates 102 and 901. Substrate 1200 is attached directly to or adjacent heat generating components such as FETs 106, and functions as a heat sink to encourage transfer of thermal energy away therefrom. Substrate 1200 may be similarly added to any of the other power converters 100, 900, 1000, and 1100 described above.

Any two or more of the associated components described above could be provided as a kit (not shown) for assembling a power converter (such as power converter 100) or a part thereof. For example, lead frame 200 may be provided as a system in a kit with PCB frame 400 for subsequent manufacture into one of the power converters described above. The kit may also include any one or more of the associated components such as FETs 106. Other combinations of frames, substrates and components may also be provided in a kit for later assembly. Partially completed assemblies could also be provided in kit form for later processing by a purchaser or assembler.

Those skilled in the art will appreciate that numerous modifications, adaptations and variations may be made to the embodiments without departing from the scope of the invention.

What is claimed is:

1. A circuit module comprising: an electrical component having at least one terminal; and a substrate formed from a stamping process, said substrate providing an exposed layer of electrically conductive material, wherein one terminal of said at least one terminal is attached to said exposed layer and said circuit module is attachable to a circuit board such that said substrate completes a part of an electrical circuit on said circuit board;

wherein said electrical circuit on said circuit board is a power conversion circuit and said substrate comprises a part of a winding associated with said power conversion circuit.

2. A circuit module as claimed in claim 1, wherein said substrate has a first portion and a second portion located apart from said first portion; said one terminal is attached to said first portion; and a second terminal of said at least one terminal of said electrical component is attached to said second portion.

3. A circuit module as claimed in claim 2 wherein said second portion comprises a nib; said second terminal is attached to said nib of said second portion; and said nib is excisable from said second portion.

4. A circuit module as claimed in claim 1, wherein said circuit module is attachable to said circuit board by a soldering process.

5. A circuit module as claimed in claim 4 wherein said substrate is adapted to transfer heat from said circuit board.

6. A circuit module as claimed in claim 5, wherein said substrate further has at least one fin to transfer heat from said circuit board.

7. A circuit module as claimed in claim 5, wherein said substrate further has a raised portion providing a space between said raised portion and said PCB when said substrate is attached to said PCB.

8. A circuit module as claimed in claim 1, wherein said substrate further has a thickness enabling said substrate to carry an electrical current of at least 5 amperes.

9. An electronic module comprising: a circuit board; a substrate attached to a location on a surface of said circuit board; and an electrical component carried on said substrate, wherein said substrate is formed from a stamping process, is adapted to dissipate heat from said circuit board and completes a part of an electrical circuit on said circuit board;

wherein said electrical circuit is a power conversion circuit and said substrate comprises a part of a winding associated with said power conversion circuit.

10. An electronic module as claimed in claim 9, wherein said substrate has a first portion and a second portion located apart from said first portion; a first terminal of said electrical component is attached to said first portion; and a second terminal of said electrical component is attached to said second portion.

11. An electronic module as claimed in claim 10, wherein said electrical component is a transistor.

12. An electronic module as claimed in claim 11, wherein said substrate further comprises at least one fin.

13. An electronic module as claimed in claim 12, wherein said substrate is attachable to said circuit board by a soldering process.

* * * * *